US010388856B2

(12) United States Patent
Sasaki

(10) Patent No.: US 10,388,856 B2
(45) Date of Patent: Aug. 20, 2019

(54) MAGNETORESISTANCE EFFECT ELEMENT

(71) Applicant: TDK CORPORATION, Tokyo (JP)

(72) Inventor: Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/719,028

(22) Filed: Sep. 28, 2017

(65) Prior Publication Data
US 2018/0090673 A1 Mar. 29, 2018

(30) Foreign Application Priority Data

Sep. 29, 2016 (JP) .................. 2016-192010

(51) Int. Cl.
G11C 11/16 (2006.01)
H01L 27/22 (2006.01)
H01L 43/02 (2006.01)
H01L 43/08 (2006.01)
H01L 43/10 (2006.01)
H01L 43/12 (2006.01)

(52) U.S. Cl.
CPC ............ *H01L 43/08* (2013.01); *G11C 11/161* (2013.01); *H01L 43/02* (2013.01); *H01L 43/10* (2013.01); *H01L 43/12* (2013.01); *H01L 27/222* (2013.01)

(58) Field of Classification Search
CPC ......... H01L 43/08; H01L 43/10; H01L 43/02; H01L 27/222; G11C 11/161
See application file for complete search history.

(56) References Cited

U.S. PATENT DOCUMENTS

2012/0091548 A1 4/2012 Sukegawa et al.
2013/0003579 A1 1/2013 Lu et al.
(Continued)

FOREIGN PATENT DOCUMENTS

JP 5586028 B2 9/2014
JP 5588019 B2 9/2014

OTHER PUBLICATIONS

Sukegawa et al., "Enhanced Tunnel Magnetoresistance in a Spinel Oxide Barrier With Cation-site Disorder", Physical Review B 86, pp. 184401-1-184401-5, 2012.
(Continued)

*Primary Examiner* — Julia Slutsker
(74) *Attorney, Agent, or Firm* — Oliff PLC

(57) ABSTRACT

Provided is a magnetoresistance effect element that that generates a high MR ratio at a lower RA than a TMR element using a material of a conventional tunnel barrier layer or $MgAl_2O_4$. The magnetoresistance effect element includes a laminate in which an underlayer, a first ferromagnetic metal layer, a tunnel barrier layer, and a second ferromagnetic metal layer are laminated in that order, wherein the underlayer is made of TiN, NbN, TaN, ZrN or mixed crystals thereof, and the tunnel barrier layer is made of a compound that has a spinel structure and expressed by composition formula (1) below: (1) $A_xIn_2O_y$, where A is the non-magnetic divalent cation and represents cations of one or more elements selected from the group consisting of magnesium and zinc, x represents a number satisfying $0<x\leq 2$, and y represents a number satisfying $0<y\leq 4$.

13 Claims, 6 Drawing Sheets

(56) References Cited

U.S. PATENT DOCUMENTS

| | | | | |
|---|---|---|---|---|
| 2013/0221461 | A1* | 8/2013 | Sukegawa | H01L 43/08 257/421 |
| 2014/0117427 | A1* | 5/2014 | Saito | H01L 29/66984 257/289 |
| 2016/0163970 | A1* | 6/2016 | Xiao | H01L 43/10 438/3 |
| 2016/0197263 | A1* | 7/2016 | Hu | H01L 43/02 365/158 |
| 2017/0148977 | A1* | 5/2017 | Zhu | H01F 10/3286 |
| 2017/0213957 | A1* | 7/2017 | Hong | H01L 43/10 |
| 2018/0061886 | A1* | 3/2018 | Tokashiki | H01L 27/222 |

OTHER PUBLICATIONS

Scheike et al., "Lattice-matched Magnetic Tunnel Junctions Using a Heusler Alloy Co2FeAl and a Cationdisorder Spinel Mg—Al—O Barrier", Applied Physics Letters, vol. 105, pp. 242407-242407-5, 2014.

Sukegawa et al., "Tunnel Magnetoresistance With Improved Bias Voltage Dependence in Lattice-Matched Fe/spinel MgAl2O4/Fe(001) Junctions", Applied Physics Letters 96, pp. 212505-212505-3, 2010.

Miura et al., "First-principles Study of Tunneling Magnetoresistance in Fe/MgAl2O4/Fe(001) Magnetic Tunnel Junctions", Physical Review B 86, pp. 024426-024426-6, 2012.

Takagishi et al., "Magnetoresistance Ratio and Resistance Area Design of CPP-MR Film for 2-5 Tb/in2 Read Sensors", IEEE Transactions on Magnetics, vol. 46, No. 6, pp. 20186-2089, 2010.

* cited by examiner

MAGNETORESISTANCE EFFECT ELEMENT

BACKGROUND OF THE INVENTION

Field of the Invention

The present invention relates to a magnetoresistance effect element.

Priority is claimed on Japanese Patent Application No. 2016-192010, filed Sep. 29, 2016, the content of which is incorporated herein by reference.

Description of Related Art

A giant magnetoresistance (GMR) element that is made of a multilayer film of a ferromagnetic layer and a non-magnetic layer and a tunnel magnetoresistance (TMR) element that uses an insulating layer (a tunnel barrier layer or a barrier layer) for a non-magnetic layer are known (JP5586028B, US2013-0221461-A, APPLIED PHYSICS LETTERS 96, 212505 (2010), Applied Physics Letters, 105, 242407 (2014), Physical Review B 86, 024426 (2012), and IEEE Trans Magn., Vol. 46, No. 6, 2086 (2010)). In general, the TMR element has higher element resistance than the GMR element, whereas a magnetoresistance (MR) ratio of the TMR element is greater than that of the GMR element, TMR elements can be classified into two types. The first type is a TMR element that uses only a tunnel effect using a proximity effect of a wave function between ferromagnetic layers. The second type is a TMR element that uses a coherent tunnel that uses conduction of a specific orbit of a non-magnetic insulating layer to be tunneled when the tunnel effect occurs. It is known that the TMR element using the coherent tunnel obtains an MR ratio greater than that of the TMR element using only the tunnel. The coherent tunnel effect is induced when a ferromagnetic layer and a non-magnetic insulating layer are crystalline, and when an interface between the ferromagnetic layer and the non-magnetic insulating layer is crystallographically continuous.

Magnetoresistance effect elements are used for various purposes. For example, a magnetoresistance effect type magnetic sensor is known as a magnetic sensor, and the magnetoresistance effect element fixes characteristics of the magnetic sensor in a playback function of a hard disk drive.

The magnetoresistance effect type magnetic sensor is a magnetic sensor that detects an effect of a direction of magnetization of the magnetoresistance effect element being changed by a magnetic field from the outside as a change in resistance of the magnetoresistance effect element.

According to IEEE Trans Magn., Vol. 46, No. 6, 2086 (2010), it is known that highest playback capability is obtained when a resistance area (RA) of the magnetoresistance effect element ranges from about 0.1 to 0.2 $\Omega \cdot \mu m^2$ in view of a high frequency response in a magnetoresistance effect type magnetic sensor for detecting a magnetic field of a micro region typified by a magnetic head.

A device expected in the future is a variable magnetoresistance random access memory (MRAM). The MRAM is a memory that adequately changes ferromagnetic directions of two layers in parallel and antiparallel and reads magnetoresistance into digital signals of 0 and 1.

SUMMARY OF THE INVENTION

Until recent years, there has been a need to use MgO as the non-magnetic insulating layer in order to generate the coherent tunnel. However, when MgO is used as the non-magnetic insulating layer, it is difficult to reduce the RA to about 0.1 to 0.2 $\Omega \cdot \mu m^2$, and there is a problem that the MR ratio is insufficient even when the RA is reduced.

In devices such as a magnetic sensor, an MRAM, or the like, a sufficient MR ratio needs to be obtained even under a high bias voltage in the future. To observe a minute magnetic field such as geomagnetism, biomagnetism, or the like in the magnetic sensor, an electric signal obtained on a circuit as a change in resistance should be amplified. To realize higher sensitivity than in the past, the MR ratio as well as an output voltage or an output current also need to be increased, and operation in a high bias voltage is required. In the case of the MRAM, high voltage operation is required for a writing operation. In a spin transfer torque (STT) MRAM, as a direction of magnetization of a ferromagnetic layer varies, higher current density needs to be applied to a magnetoresistance effect element. The direction of magnetization of the ferromagnetic layer is an effect of a spin polarization current acting on a spin of the ferromagnetic layer. Like the MR ratio, a rewriting current is caused by a strong spin polarization current, and thus a high MR ratio is also required under a high bias voltage in the STT-MRAM in the same manner.

In JP5586028 and APPLIED PHYSICS LETTERS 96, 212505 (2010), it is reported that a tunnel barrier of a spinel structure is effective as a material substituting for MgO. it is known that a spinel tunnel barrier represented by a composition formula of $MgAl_2O_4$ can obtain the same MR ratio as MgO and simultaneously obtain a higher MR ratio than MgO under a high bias voltage. It is described in US2013-0221461-A, Applied Physics Letters, 105, 242407 (2014), and Physical Review B 86, 024426 (2012) that it is necessary for $MgAl_2O_4$ to be a disordered spinel structure to obtain a high MR ratio. The disordered spinel structure mentioned herein indicates a structure in which arrangement of O atoms of the spinel structure takes nearly the same closest packed cubic lattice as a spinel, but holds a structure in which atomic arrangement of Mg and Al is disordered, and is a cubic crystal as a whole. In the authentic spinel structure, Mg and Al are regularly arranged in tetrahedral and octahedral voids of oxygen ions. However, the disordered spinel structure has a structure in which, since these atoms are randomly arranged, the symmetry of crystal is changed, and a lattice constant is substantially reduced from about 0.808 nm of $MgAl_2O_4$ by half. In US2013-0221461-A, a spinel structure represented by the composition formulae of $AB_2O_4$ and $A_2B'O_4$ are given as examples. In the spinel structure represented by $AB_2O_4$, A is one or more elements selected from Mg, Zn, Cu, Cd, Li, Ni, Fe, Co, Mn, Cr, Hg, and V, and B is one or more elements selected from Al, Ga. In, Sc, Ti, V, Cr, Mn, Fe, Rh, Ir, and Co. In the spinel structure represented by $A_2B'O_4$, A is one or more elements selected from Mg, Zn, Cu, Cd, Li, Ni, Fe, Co, Mn, Cr, Hg, Ag, and V, and B' is one or more elements selected from Ti, Mn, Si, Ge, Mo, and Sn.

The present invention was made in view of the above circumstances, and an object thereof is to provide a magnetoresistance effect element that generates a high MR ratio at a lower RA than a TMR element using a material of a conventional tunnel barrier layer or $MgAl_2O_4$.

To solve the above problems, a magnetoresistance effect element according to the present invention includes a laminate in in which: an underlayer; a first ferromagnetic metal layer; a tunnel barrier layer; and a second ferromagnetic metal layer are laminated in that order, wherein the underlayer is made of TiN, NbN, TaN, ZrN or mixed crystals thereof, and the tunnel barrier layer is made of a compound that has a spinel structure and expressed by composition formula (1) below.

$$A_x In_2 O_y \tag{1}$$

A is a non-magnetic divalent cation and represents cations of one or more elements selected from a group consisting of magnesium and zinc, x represents a number satisfying $0<x\leq2$, and y represents a number satisfying $0<y\leq4$.

A spinel material including trivalent indium (In) and oxygen has a smaller band gap than a conventional spinel material using Al as a trivalent cation such as $MgAl_2O_4$. For this reason, in comparison with the conventional magnetoresistance effect element, the magnetoresistance effect element of the present invention makes possible the discovery that resistance of the tunnel barrier layer is low and a magnetoresistance (MR) ratio is high at a low resistance area (RA).

Moreover, it is believed that the MR ratio at the low RA is further improved by having the configuration in which the underlayer is made of TiN, NbN, TaN, ZrN, or mixed crystals thereof. Although the reason for this is not clear, the inventors found that, when a difference between a crystal lattice constant of a material constituting the tunnel barrier layer and a number obtained by multiplying a crystal lattice constant that a nitride constituting the underlayer has by n (n is a natural number or 1/natural number) is smaller, the MR ratio is larger. Therefore, influence of the under layer on the crystallinity of the tunnel barrier layer should be taken into account. This result contradicts with the conventional wisdom. Generally, it is said that a nitride film formed by a reactive sputtering method is amorphous. Therefore, a TiN film, an NbN film, a TaN film, and a ZrN film formed by the reactive sputtering method used in examples are amorphous. However, when the underlayer is completely amorphous, there is no crystallographic correlation with a layer thereabove, and the result obtained by the inventors contradicts with the conventional wisdom.

The reason for this is inferred to be as follows. Since no atomic image is obtained even if the underlayer of the present invention is observed through TEM, it cannot be said that the underlayer is completely crystallized. On the other hand, the underlayer cannot be said to be completely amorphous, and although there is not an extent to obtain an atomic image through TEM, it is believed that an image that locally includes a crystalline part may be close to reality.

The present invention reveals new prospects for increasing the MR ratio of the magnetoresistance effect element with respect to a current state in which the nitride film formed by the reactive sputtering method is amorphous.

Here, as will be described below in examples, the result can be described by comparing a lattice mismatching degree obtained from a crystal lattice constant that a nitride (TiN, NbN, TaN, ZrN and mixed crystals thereof) constituting an underlayer of a magnetoresistance effect element has and a lattice constant of a tunnel barrier layer with the MR ratio. The crystal structure that TiN, NbN, TaN, ZrN and mixed crystals thereof can have is generally a tetragonal structure (NaCl structure) and is a crystal structure in which a space group is Fm-3m. A crystal lattice constant of the structure is disclosed in, for example, "AtomWork" (accessed on Aug. 23, 2016, URL http://crystdb.nims.go.jp/) provided by National Institute for Materials Science (Japan).

Further, since TiN, NbN, TaN, and ZrN are conductive, the underlayer is made of these nitrides. Thereby, a voltage can be applied to the magnetoresistance effect element via the underlayer, and a constitution of the element can be simplified. Since the nitride such as TiN, NbN, TaN, ZrN or the like has higher electric resistivity than a metal (e.g., copper or tantalum) used for an electrode of the conventional magnetoresistance effect element, resistance of the magnetoresistance effect element is increased. However, a film thickness of the nitride is sufficiently reduced, and thereby an influence on resistance of the underlayer can be reduced. For example, if the film thickness of the nitride is set to 20.0 nm or less (especially, 10.0 nm or less), the influence on resistance of the underlayer of the magnetoresistance effect element can be reduced.

In the magnetoresistance effect element, the tunnel barrier layer may have a lattice-matched portion that lattice-matches with both of the first ferromagnetic metal layer and the second ferromagnetic metal layer; and a lattice-mismatched portion that is free of lattice-matching with at least one of the first ferromagnetic metal layer and the second ferromagnetic metal layer.

In the magnetoresistance effect element, the tunnel barrier layer may have a spinel structure in which atomic arrangement is disordered. The tunnel barrier layer has a spinel structure in which atomic arrangement is disordered, and thereby, due to an effect of folding an electron band, the coherent tunnel effect is increased, and the MR ratio is increased.

In the magnetoresistance effect element, a difference between ion radii of divalent cations in a plurality of non-magnetic elements may be less than or equal to 0.2 angstroms. When the difference between ion radii is small, the cations are not easily ordered, and have a smaller lattice constant than a general spinel structure. Thus, in the case of two or more elements having similar ion radii, the MR ratio is further increased.

x may be a number satisfying $x<1$. The number of constituent elements of the divalent cation is set to be less than half of a trivalent cation. Thereby, vacancies occur at the cation, and the vacancies and two or more non-magnetic elements occupy the cation. Thus, periodicity of the lattice is disturbed, and thus the MR ratio is increased.

In the magnetoresistance effect element, a coercivity of the second ferromagnetic metal layer may be greater than a coercivity of the first ferromagnetic metal layer.

The coercivity of the first and second ferromagnetic metal layers are different from each other, and thereby a function as a spin valve and device application are possible.

In the magnetoresistance effect element, a thickness of the tunnel barrier layer may be 0.7 nm or more and 1.7 nm or less.

In this case, a high MR ratio is obtained, and the magnetoresistance effect element can be used even in devices to which a high bias voltage is applied such as a high-sensitivity magnetic sensor, a logic-in-memory, and an MRAM.

In the magnetoresistance effect element, a thickness of the underlayer may be 1.0 nm or more and 20.0 nm or less.

As the thickness of the underlayer is set to this range, uniformity of crystal sizes and orientation of the tunnel barrier layer can be reliably improved. Since the nitride generally has higher electric resistivity than the metal, the thickness of the nitride is preferably thin when the nitride is used as the underlayer. The film thickness of the nitride is made thin, and thereby resistance of a circuit including the magnetoresistance effect element is reduced, and an effective magnetoresistance ratio can be increased.

In the magnetoresistance effect element, at least one of the first ferromagnetic metal layer and the second ferromagnetic metal layer may have a magnetic anisotropy that is perpendicular to a laminating direction.

Since there is no need to apply a bias magnetic field, a size of the device can be reduced. Due to high thermal disturbance resistance, the magnetoresistance effect element enables a function as a recording element.

In the magnetoresistance effect element, at least one of the first ferromagnetic metal layer and the second ferromagnetic metal layer may be $Co_2Mn_{1-a}Fe_aAl_bSi_{1-b}$ ($0 \leq a \leq 1$ and $0 \leq b \leq 1$).

$Co_2Mn_{1-a}Fe_aAl_bSi_{1-b}$ is a ferromagnetic metal material having high spin polarizability, and a high MR ratio can be obtained compared to other ferromagnetic metal materials.

According to the present invention, a magnetoresistance effect element that generates a high MR ratio at a lower RA than a TMR element using a material of the conventional tunnel barrier layer or $MgAl_2O_4$ can be provided.

DETAILED DESCRIPTION OF THE INVENTION

Figure 1:
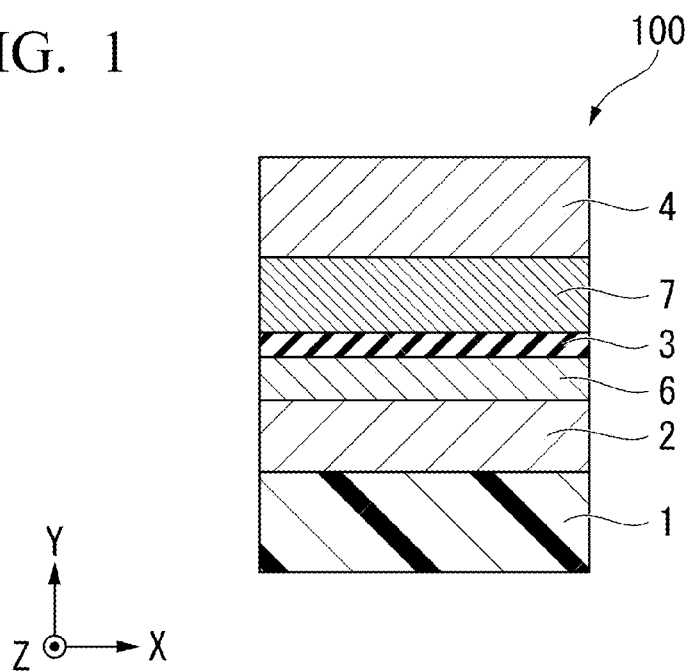
FIG. 1 is a cross-sectional view illustrating a laminated structure of a magnetoresistance effect element.

Hereinafter, embodiments of the present invention will be described in detail with reference to the attached drawings. In the description of the drawings, the same elements will be given the same reference signs, and duplicate description thereof will be omitted.

First Embodiment

A magnetoresistance effect element 100 according to the first embodiment will be described. The magnetoresistance effect element 100 has a laminate in which an underlayer 2, a first ferromagnetic metal layer 6, a tunnel barrier layer 3, and a second ferromagnetic metal layer 7 are laminated in that order. The underlayer 2 is made of TiN, VN, or mixed crystals thereof. The tunnel barrier layer 3 is characterized in that it is made of a compound represented by the following composition formula (1) having a spinel structure.

$$A_xIn_2O_y \quad (1)$$

In the formula, A is a non-magnetic divalent cation and represents cations of one or more elements selected from the group consisting of magnesium, zinc, and cadmium, x represents a number satisfying $0 < x \leq 2$, and preferably $x < 1$, and y represents a number satisfying $0 < y \leq 4$.

(Basic Structure)

In the example illustrated in FIG. 1, the magnetoresistance effect element 100 is provided on a substrate 1, and is a laminated structure having the underlayer 2, the first ferromagnetic metal layer 6, the tunnel barrier layer 3, the second ferromagnetic metal layer 7, and a cap layer 4 from the substrate 1 in turn.

(Underlayer)

The underlayer 2 is made of TiN, NbN, TaN, ZrN, or mixed crystals thereof.

Here, the term "mixed crystal" is used for convenience, but does not mean that the underlayer is crystallized. Giving the mixed crystal of TiN and TaN as an example, the underlayer is simply a film formed using TiN and TaN together, and may also be referred to as a mixed film of TiN and TaN. TiN and TaN are a material composed of Ti and N and a material composed of Ta and N, respectively, and an atomic ratio of the metal element and N does not need to be 1:1. The atomic ratio of the metal element and N is preferably in a range of 1:0.5 to 1:2 (=metal element:N). A thickness of the underlayer 2 is preferably 1.0 nm or more and 20.0 nm or less, and more preferably 1.0 nm or more and 10.0 nm or less.

(Tunnel Barrier Layer)

The tunnel barrier layer 3 is made of a non-magnetic insulating material. In general, a thickness of the tunnel barrier layer is 3 nm or less, and preferably 0.7 nm or more and 1.7 nm or less. When the tunnel barrier layer 3 is interposed between metal materials, a wave function of electrons which atoms of the metal material have spreads across the tunnel barrier layer 3, and thus a current can flow even when an insulator is present on a circuit. The magnetoresistance effect element 100 has a structure in which the tunnel barrier layer 3 is interposed between ferromagnetic metal materials, and a resistance value is fixed by a relative angle between directions of magnetization of the interposed ferromagnetic metals. In the magnetoresistance effect element 100, there are an ordinary tunnel effect and a coherent tunnel effect in which an orbit during tunneling is restricted. In the ordinary tunnel effect, a magnetoresistance effect is obtained by a spin polarizability of the ferromagnetic material. Meanwhile, in the coherent tunnel, since the orbit during tunneling is restricted, an effect greater than that of the spin polarizability of the ferromagnetic material is expected. Therefore, to discover the coherent tunnel effect, the ferromagnetic material and the tunnel barrier layer 3 need to be crystallized and bonded at a specific orientation.

(Spinel Structure)

Figure 2:
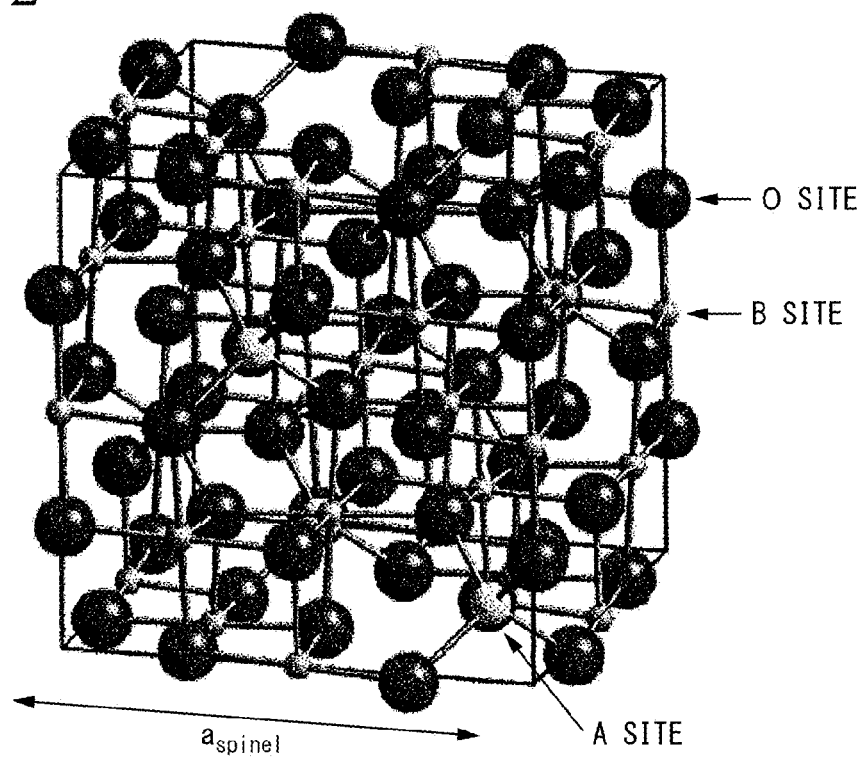
FIG. 2 is a schematic view of an example of a crystal structure of an ordered spinel constituting a tunnel barrier layer of the magnetoresistance effect element according to an aspect of the present invention.
Figure 3:
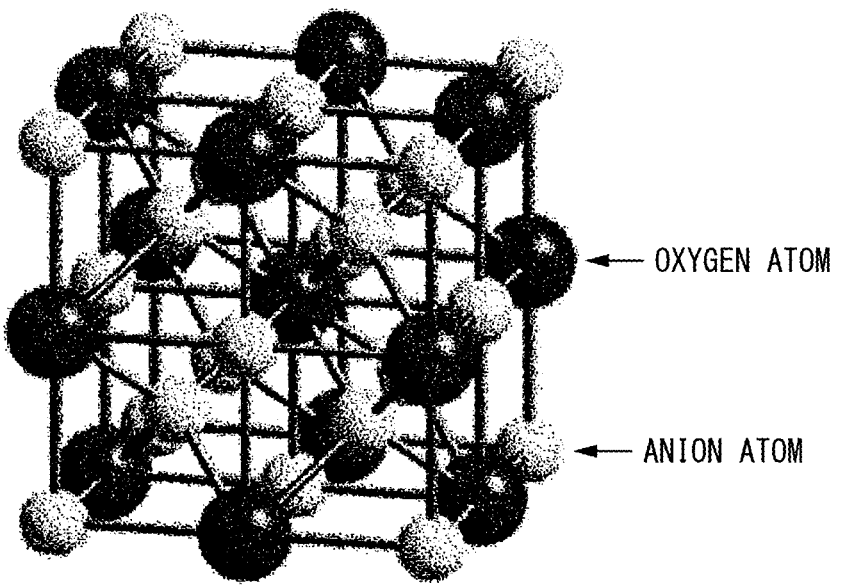
FIG. 3 is a schematic view of an example of a crystal structure of a disordered spinel constituting the tunnel barrier layer of the magnetoresistance effect element according to the aspect of the present invention.
Figure 4:
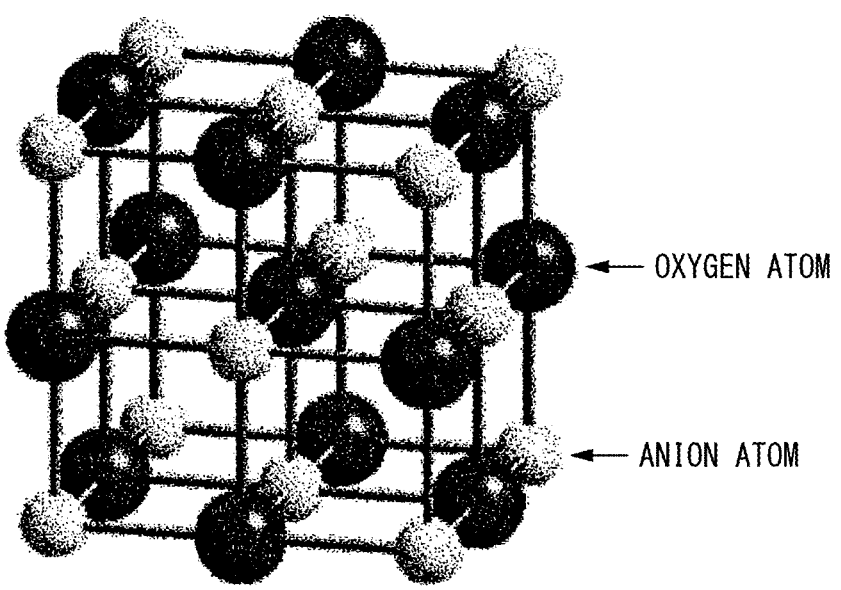
FIG. 4 is a schematic view of another example of the crystal structure of the disordered spinel constituting the tunnel barrier layer of the magnetoresistance effect element according to the aspect of the present invention.
Figure 5:
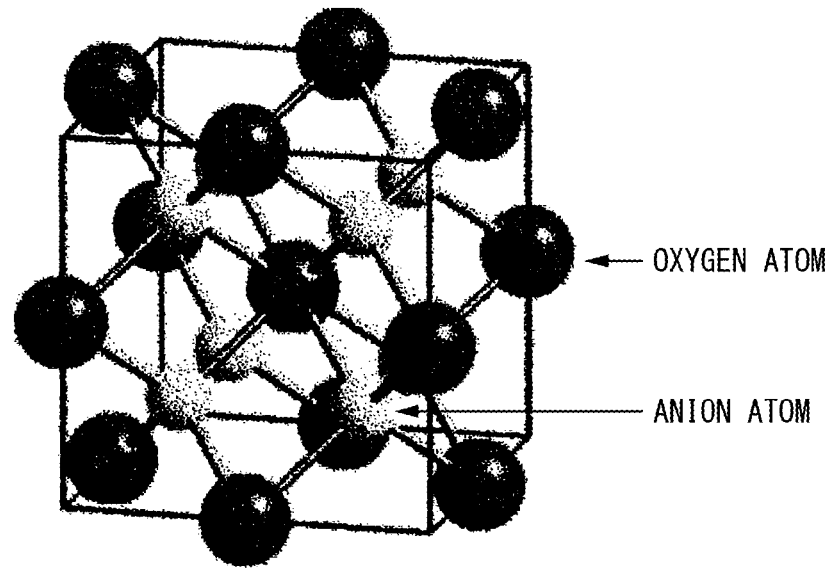
FIG. 5 is a schematic view of yet another example of the crystal structure of the disordered spinel constituting the tunnel barrier layer of the magnetoresistance effect element according to the aspect of the present invention.
Figure 6:
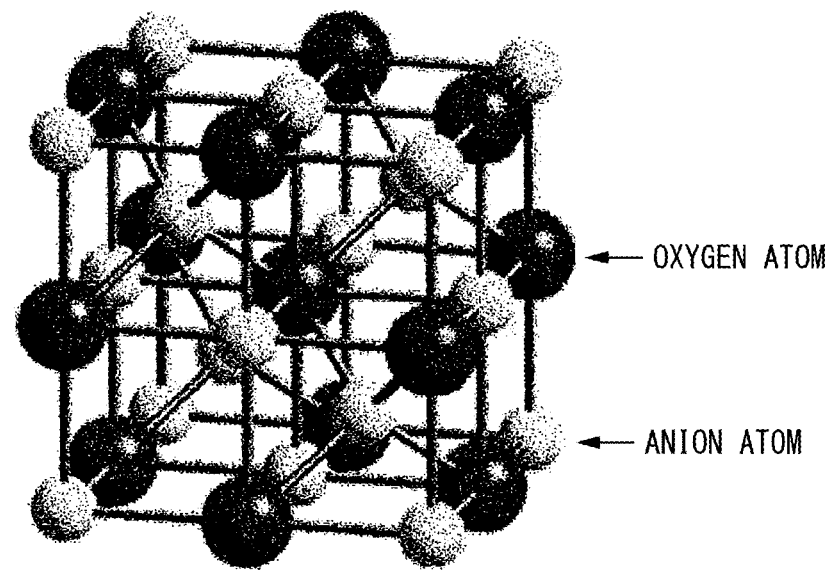
FIG. 6 is a schematic view of yet another example of the crystal structure of the disordered spinel constituting the tunnel barrier layer of the magnetoresistance effect element according to the aspect of the present invention.
Figure 7:
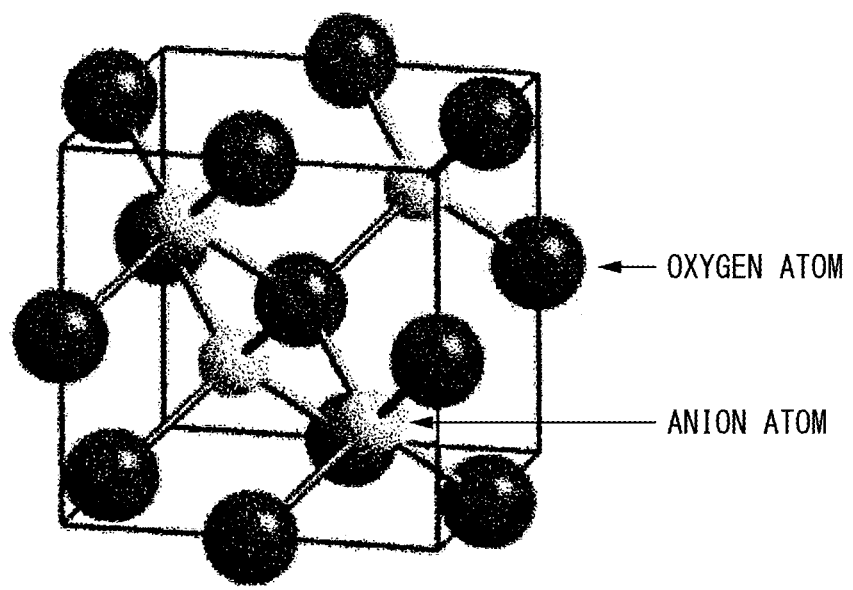
FIG. 7 is a schematic view of yet another example of the crystal structure of the disordered spinel constituting the tunnel barrier layer of the magnetoresistance effect element according to the aspect of the present invention.

The non-magnetic insulating material of which the tunnel barrier layer 3 is formed is a compound represented by the above composition formula (1) having a spinel structure. Here, in the present embodiment, the spinel structure includes an ordered spinel structure and a spinel structure in which atomic arrangement is disordered (a disordered spinel structure). As illustrated in FIG. 2, the ordered spinel structure is a structure which has A sites in which oxygen atoms are tetra-coordinated to cations and B sites in which oxygen atoms are hexa-coordinated to cations, in which arrangement of the oxygen atoms takes a closest packed cubic lattice, and which is a cubic crystal as a whole. The disordered spinel structure is a structure in which the arrangement of the oxygen atoms takes nearly the same closest packed cubic lattice as the ordered spinel structure, but atomic arrangement of the cations is disordered. That is, in the ordered spinel structure, the cations are regularly arranged in tetrahedral and octahedral voids of the oxygen atoms. Meanwhile, the disordered spinel structure is a structure in which, since these cations are randomly arranged, the symmetry of crystal is changed, and a lattice constant is substantially reduced by half. It is known that a space group of the ordered spinel structure represented by, for instance, $MgAl_2O_4$ is $Fd$-3m, but a space group of the disordered spinel structure in which the lattice constant is reduced by half becomes Fm-3m or F-43m. The disordered spinel structure has a possibility of five structures illustrated in FIGS. 3 to 7 in whole, but it may be any one of these structures or a structure in which these are mixed. The disordered spinel structure is sometimes referred to as a Sukenel structure.

In the disordered spinel structure, repeating units of the lattice are changed, and thereby a combination of a ferromagnetic layer material and an electron structure (a band structure) is changed. For this reason, in the disordered spinel structure, in comparison with the ordered spinel structure, great TMR enhancement caused by the coherent tunnel effect is realized. The tunnel barrier layer 3 has the disordered spinel structure, and thereby the coherent tunnel effect is increased by the folding effect of electron bands, and an MR ratio is increased.

In the present embodiment, the disordered spinel structure is not necessarily the cubic crystal as a whole. A crystal structure of the non-magnetic insulating material of which the tunnel barrier layer 3 is formed is affected by the crystal structure of the basic material, and the lattice is partly strained. Each material has a bulk crystal structure. However, when the material is formed into a thin film, the bulk crystal structure is used as a reference, and a partly strained crystal structure is taken.

Especially, the tunnel barrier layer 3 in the present embodiment is a thin film that is very thin, and is easily affected by crystal structures of the layers that are in contact with the tunnel barrier layer 3. However, the material having the disordered spinel structure includes a structure in which the bulk crystal structure is basically the cubic crystal, and which is slightly deviated from the cubic crystal even when the disordered spinel structure in the present embodiment is not the cubic crystal. In general, in the present embodiment, the deviation from the cubic crystal in the disordered spinel structure is slight, and depends on accuracy of the measuring method for evaluating the crystal structure.

Among the non-magnetic elements contained in the tunnel barrier layer 3, the divalent cation, that is, A of the composition formula (1), forms the A site of the spinel structure. The divalent cation forming the A site is cations of one or more non-magnetic elements selected from the group consisting of magnesium and zinc. When the magnesium and the zinc are in a stable state at a divalence and become constituent elements of the tunnel barrier layer, the coherent tunnel can be realized, and the MR ratio is increased.

The oxygen contained in the tunnel barrier layer 3 is tetra-coordinated to the divalent cation to form the A site, and is hexa-coordinated to the trivalent cation to form the B site. The oxygen may be deficient. For this reason, in the composition formula (1), y is the number satisfying $0<y\leq4$. However, the tunnel barrier layer 3 may have a portion in which y of composition formula (1) exceeds 4.

Among the non-magnetic elements contained in the tunnel barrier layer 3, the indium forms the B site of the spinel structure. As the B site includes the indium and the oxygen, a gap with respect to a valence band is narrowed, and low RA can be realized.

(Relation Between the Underlayer and the Tunnel Barrier Layer)

The underlayer 2 and the tunnel barrier layer 3 preferably have a small difference in lattice constant. That is, a difference between the lattice constant of the crystal structure that can be taken by the underlayer 2 and the lattice constant of the tunnel barrier layer 3 is preferably small. To be specific, a lattice-mismatching degree defined by the following formula is selected to be within 5%, and preferably within 3%.

Lattice mismatching degree (%)=|C−nD|/nD×100

Here, C is the lattice constant of the tunnel barrier layer 3, and D is the lattice constant of the crystal structure that can be taken by the underlayer 2. n is the natural number or 1/the natural number, and usually any one of 1, 1/2, or 2.

The "crystal structure that can be taken by the underlayer 2" is a crystal structure that can be taken when TiN, NbN, TaN, ZrN, or mixed crystals thereof of which the underlayer 2 is (inherently) formed is used as a bulk, and refers to a crystal structure which the underlayer 2 is considered to have. As described above, the underlayer 2 is believed to have an intermediate state between a completely crystallized state and an amorphous state. For this reason, it cannot be clearly defined what kind of structure the crystal structure of the underlayer 2 has. Meanwhile, the actual crystal structure of the underlayer 2 is not expected to significantly differ from the crystal structure that can be taken when the material of which the underlayer 2 is formed is used as the bulk. There is a tetragonal structure as the crystal structure that can be taken by the underlayer 2.

When the difference between the lattice constants of the underlayer 2 and the tunnel barrier layer 3 is reduced, the MR ratio of the magnetoresistance effect element 100 is improved. As described above, the deriver 2 formed by the reactive sputtering method is believed to be amorphous. For this reason, a coherent characteristic between the crystal structure of the tunnel barrier layer 3 and the crystal structure that can be taken by the underlayer 2 exerts an influence on the improvement of the MR ratio of the magnetoresistance effect element 100, which is a novel finding.

(First Ferromagnetic Metal Layer)

As a material of the first ferromagnetic metal layer 6, a ferromagnetic material, particularly a soft magnetic material, is applied. The material may include, for example, a metal selected from the group consisting of Cr, Mn, Co, Fe, and Ni, an alloy containing one or more from this group of metals, or an alloy containing one or numerous metals selected from the group and at least one or more of the elements B, C, and N. To be specific, Co—Fe, Co—Fe—B, or Ni—Fe may be given as an example.

When a direction of magnetization of the first ferromagnetic metal layer 6 is perpendicular to the lamination surface, the thickness of the first ferromagnetic metal layer 6 is preferably set to 2.5 nm or less. Perpendicular magnetic anisotropy can he given to the first ferromagnetic metal layer 6 at the interface between the first ferromagnetic metal layer 6 and the tunnel barrier layer 3. The perpendicular magnetic anisotropy has an attenuated effect when the thickness of the first ferromagnetic metal layer 6 is increased, and thus the thickness of the first ferromagnetic metal layer 6 is preferably thin.

(Second Ferromagnetic Metal Layer)

A material of the second ferromagnetic metal layer 7 may include, for example, a metal selected from the group consisting of Cr, Mn, Co, Fe, and Ni, an alloy containing one or more from this group of metals, or an alloy containing one or numerous metals selected from this group and at least one or more of the elements B, C, and N. To be specific, Co—Fe, Co—Fe—B, or Ni—Fe may be given as an example. Further, to obtain high output, the Heusler alloy such as $Co_2FeSi$ is preferred. Heusler alloys include intermetallic compounds having the chemical composition of $X_2YZ$ where X is the transition metal element in a Co, Fe, Ni, or Cu group on the periodic table or a noble metal element, Y is the transition metal element in a Mn, V, Cr, or Ti group or can be one of the elements of X, and Z is a typical element in groups III to V. For example, $Co_2FeSi$, $Co_2MnSi$, or $Co_2Mn_{1-a}Fe_aAl_bSi_{1-b}$ may be given as an example. To make the coercivity stronger than that of the first ferromagnetic metal layer 6, an anti-ferromagnetic material such as IrMn, PtMn or the like may be used as a material that is in contact with the second ferromagnetic metal layer 7. Further, to prevent a leakage magnetic field of the second ferromagnetic metal layer 7 from affecting the first ferromagnetic metal layer 6, a structure of synthetic ferromagnetic coupling may be used.

When a direction of magnetization of the second ferromagnetic metal layer 7 is perpendicular to the lamination surface, a laminated film of Co and Pt is preferably used. When the second ferromagnetic metal layer 7 is set to, for example, [Co (0.24 nm)/Pt (0.16 nm)]$_6$/Ru (0.9 nm)/[Pt (0.16 nm)/Co (0.16 nm)]$_4$/Ta (0.2 nm)/FeB (1.0 nm), the direction of magnetization can be made perpendicular.

In general, the first ferromagnetic metal layer 6 is referred to as a free layer because the direction of magnetization can be more easily changed by an external magnetic field or spin torque than that of the second ferromagnetic metal layer 7. The second ferromagnetic metal layer 7 has a structure in which the direction of magnetization is fixed, and the second ferromagnetic metal layer 7 is referred to as a fixed layer.

(Substrate)

The magnetoresistance effect element according to the present invention may be formed on the substrate, In that case, a material having excellent flatness is preferably used for the substrate 1. The substrate 1 differs according to a targeted product. For example, in the case of an MRAM, a circuit formed of a Si substrate below the magnetoresistance effect element can be used. Alternatively, in the case of a magnetic head, an AlTiC substrate that is easily processed can be used.

(Cap Layer)

In the magnetoresistance effect element according to the present invention, the cap layer may be formed on the surface of the second ferromagnetic metal layer 7 which is located at the side opposite to the tunnel barrier layer 3 side (an upper surface of the second ferromagnetic metal layer 7 in FIG. 1).

The cap layer 4 is provided on the upper portion of the second ferromagnetic metal layer 7 in the laminating direction, and is used to control crystalline characteristics such as a crystal orientation, a grain size, etc. of the second ferromagnetic metal layer 7 or diffusion of an element. When the crystal structure of the second ferromagnetic metal layer 7 is the bcc structure, the crystal structure of the cap layer 4 may be any one of the fcc structure, the hcp structure, or the bcc structure. When the crystal structure of the second ferromagnetic metal layer 7 is the fcc structure, the crystal structure of the cap layer 4 may be any one of the fcc structure, the hcp structure, or the bcc structure. A thickness of the cap layer 4 may be within the range within which the strain relaxing effect is obtained and furthermore reduction in MR ratio caused by a shunt is not observed. The thickness of the cap layer 4 is preferably 1 nm or more and 30 nm or less.

(Shape and Dimensions of the Element)

The laminate made up of the first ferromagnetic metal layer 6, the tunnel barrier layer 3, and the second ferromagnetic metal layer 7 constituting the present invention has a pillar shape. A shape of the laminate viewed from the top may be any of various shapes such as a circular shape, a quadrangular shape, a triangular shape, a polygonal shape, or the like, and is preferably the circular shape in the aspect of symmetry. That is, the laminate preferably has a columnar shape.

When the laminate has a columnar shape, a diameter of a circle viewed from the top is preferably 80 nm or less, more preferably 60 nm or less, and still more preferably 30 nm or less.

When the diameter is 60 nm or less, the domain structure is hardly generated within the ferromagnetic metal layer, and there is no need to take into account a component having spin polarization different from that of the ferromagnetic metal layer. Further, when the diameter is 30 nm or less, the ferromagnetic metal layer has a single domain structure, and a magnetization reversal rate and a probability increase. In addition, in a miniaturized magnetoresistance effect element, in particular, there is a strong demand for reducing the resistance.

(Configuration at the Time of Use)

Figure 8:
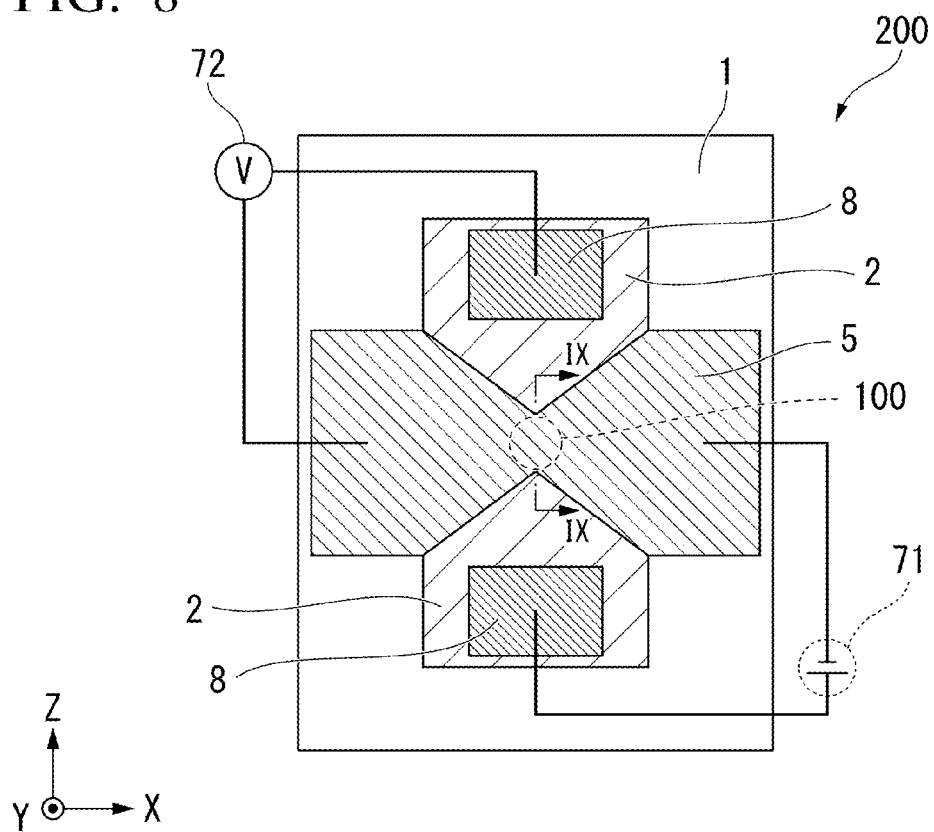
FIG. 8 is a plan view of a magnetoresistance effect device having the magnetoresistance effect element according to the aspect of the present invention.
Figure 9:
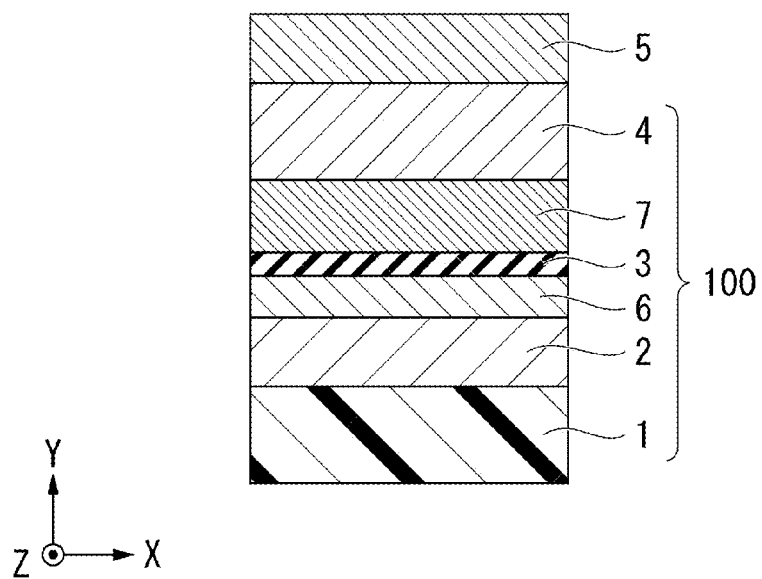
FIG. 9 is a cross-sectional view taken along line IX-IX of FIG. 8.

FIG. 8 and FIG. 9 show examples of a magnetoresistance effect device including the magnetoresistance effect element of the present embodiment.

FIG. 8 is a plan view of a magnetoresistance effect device 200 (a diagram in which the magnetoresistance effect device 200 is viewed from the above in a lamination direction). FIG. 9 is a cross-sectional view taken along the line IX-IX in FIG. 8. in the magnetoresistance effect device 200 shown in FIG. 8 and FIG. 9, an electrode layer 5 that extends in the x direction is formed on the cap layer 4 of the magnetoresistance effect element 100. The underlayer 2 extends in the z direction past an end of the first ferromagnetic metal layer 6, and an electrode pad 8 is formed above the extended portion. Between the electrode layer 5 and the electrode pad 8, a current source 71 and a voltmeter 72 are provided. When voltage is applied to the underlayer 2 and the electrode layer 5 by the current source 71, the current flows in the lamination direction of the laminate including the first ferromagnetic metal layer 6, the tunnel barrier layer 3, and the second ferromagnetic metal layer 7. The applied voltage at this time is monitored by the voltmeter 72.

(Evaluation Method)

An exemplary method of evaluating the magnetoresistance effect element 100 will be described with reference to FIG. 8 and FIG. 9. For example, as shown in FIG. 8, the current source 71 and the voltmeter 72 are provided, constant current or constant voltage is applied to the magnetoresistance effect element 100, and the voltage or the current is measured while sweeping a magnetic field from the outside. Thus, a change in the resistance of the magnetoresistance effect element 100 can be observed.

The MR ratio is generally represented by the following formula.

$$\text{MR ratio (\%)} = \{(R_{AP} - R_P)/R_P\} \times 100$$

$R_P$ is a resistance when magnetization directions of the first ferromagnetic metal layer 6 and the second ferromagnetic metal layer 7 are parallel. RAP is a resistance when magnetization directions of the first ferromagnetic metal layer 6 and the second ferromagnetic metal layer 7 are antiparallel.

An area resistance (RA) is calculated by dividing a resistance value obtained by dividing an applied bias voltage by a current that flows in a lamination direction of the magnetoresistance effect element by an area of a surface to which layers are bonded, and is a normalized resistance value in a unit area. An applied bias voltage and a value of a current that flows in a lamination direction of the magnetoresistance effect element can be obtained by measurement using a voltmeter and an ammeter.

When strong current flows in the magnetoresistance effect element 100, rotation of magnetization is caused by the effect of STT, and the resistance value of the magnetoresistance effect element 100 varies abruptly. The current value obtained when the resistance value varies abruptly is referred to as an inversion current value Jc.

(Others)

In the present embodiment, as the magnetoresistance effect element 100, an example of a so-called top pin structure in which the first ferromagnetic metal layer 6 is used as the magnetization free layer and the second ferromagnetic metal layer 7 is used as the magnetization fixed layer is given, but the structure of the magnetoresistance effect element 100 is not particularly limited by the description. Since the magnetization fixed layer is generally made up of a plurality of layers, when the first ferromagnetic metal layer 6 is used as the magnetization fixed layer, many layers are interposed between the underlayer 2 and the tunnel barrier layer 3, and the effects of the present invention are reduced. In contrast, in the case of the top pin structure, the coercivity of the first ferromagnetic metal layer 6 is reduced, but the magnetization free layer that is a single layer is only interposed between the underlayer 2 and the tunnel barrier layer 3. Thus, the effects of the present invention are sufficiently great, and the MR ratio can be further increased. The structure of the magnetoresistance effect element 100 may be a so-called bottom pin structure in which the first ferromagnetic metal layer 6 is used as the magnetization fixed layer and the second ferromagnetic metal layer 7 is used as the magnetization free layer.

In order to utilize the magnetoresistance effect element as a magnetic sensor, a change in resistance with respect to an external magnetic field is preferably linear. In a laminate film of a general ferromagnetic layer, a magnetization direction is easily directed into a lamination surface due to shape anisotropy. In this case, for example, when a magnetic field is applied from the outside and magnetization directions of the first ferromagnetic metal layer and the second ferromagnetic metal layer are perpendicular to each other, a change in resistance with respect to the external magnetic field is linear. However, in this case, since a mechanism for applying a magnetic field to the vicinity of the magnetoresistance effect element is necessary, this is not desirable for integration. When the ferromagnetic metal layer itself has vertical magnetic anisotropy, a method of applying a magnetic field from the outside is unnecessary, and this is beneficial for integration.

The magnetoresistance effect element using the present embodiment can be used as a magnetic sensor or a memory such as an MRAM. Especially, a size of the element in the conventional magnetic sensor or MRAM is reduced, and thereby the RA needs to be reduced to improve a magnetic field resolution or integration, and the present embodiment is effective.

(Production Method)

The underlayer 2, the first ferromagnetic metal layer 6, the tunnel barrier layer 3, the second ferromagnetic metal layer 7, and the cap layer 4 constituting the magnetoresistance effect element 100 can be formed, for example, using a magnetron sputtering apparatus.

The underlayer 2 can be produced according to a known method, and for example, can be produced by a reactive sputtering method using a mixed gas containing Ar and nitrogen as a sputtering gas.

The tunnel barrier layer 3 can be produced according to a known method. For example, a thin metal film is sputtered onto the first ferromagnetic metal layer 6, natural oxidation occurs due to plasma oxidation or oxygen introduction, and a subsequent heat treatment is performed for formation. As a film formation method, general thin film producing methods such as a vapor deposition method, a laser ablation method, and an MBE method can be used in addition to a magnetron sputtering method.

The first ferromagnetic metal layer 6, the second ferromagnetic metal layer 7, and the cap layer 4 can be produced according to a known method.

The underlayer 2, the first ferromagnetic metal layer 6, the tunnel barrier layer 3, the second ferromagnetic metal layer 7, and the cap layer 4 are formed and laminated into a film in that order. The obtained laminated film is preferably subjected to an annealing treatment. A nitride layer (the underlayer 2) formed of NbN, TaN, or mixed crystals thereof by a reactive sputtering method is generally amorphous. The magnetoresistance effect element 100 produced by the annealing treatment has an. improved MR ratio compared to the magnetoresistance effect element 100 produced without the annealing treatment. This is believed to be because the underlayer 2 is partly crystallized by the annealing treatment, and thereby uniformity of crystal sizes of the tunnel barrier layer 3 and orientation thereof can be improved. In the annealing treatment, the magnetoresistance effect element is preferably heated in an inert atmosphere such as Ar at a temperature of 300° C. or higher and 500° C. or lower for a time of 5 minutes or more and 100 minutes or less, and then heated at a temperature of 100° C. or higher and 500° C. or lower for a time of 1 hour or more and 10 hours or less in a state in which a magnetic field of 2 kOe or more and 10 kOe or less is applied.

Second Embodiment

A difference between a second embodiment and the first embodiment is only a method of forming a tunnel barrier layer. In the first embodiment, the tunnel barrier layer is formed by repeatedly performing formation of a metal film, oxidation, formation of a metal film, and oxidation. In the second embodiment, in the oxidation process, a temperature of the substrate is cooled to −70 to −30° C., and then oxidation is performed. When the substrate is cooled, a temperature gradient occurs between the substrate and a vacuum or between the substrate and plasma. First, when oxygen is brought into contact with a surface of the substrate, it reacts with a metal material and oxidation occurs. However, since the temperature is low, oxidation does not proceed. Accordingly, it is easy to adjust an amount of oxygen in the tunnel barrier layer. In addition, when the temperature gradient is formed, it is easy to adjust epitaxial growth (lattice-matched growth). Since crystal growth proceeds according to the temperature gradient, when the temperature of the substrate is sufficiently cooled, epitaxial growth easily occurs. In addition, when the temperature of the substrate increases, a plurality of crystal nuclei are formed inside a surface in which a domain is formed, and crystal nuclei grow independently epitaxially. Therefore, in a portion in which crystal-grown domains are in contact with each other, a portion in which lattices do not match is formed.

Preferably, a part of the tunnel barrier layer has a lattice-matched portion that is lattice-matched with both of the first ferromagnetic metal layer and the second ferromagnetic metal layer. In general, the tunnel barrier layer that is completely lattice-matched with both of the first ferromagnetic metal layer and the second ferromagnetic metal layer is preferable.

However, when complete lattice matching occurs, since electrons that are spin-polarized when they pass through the tunnel barrier layer interfere with each other, hardly any pass through the tunnel barrier layer. On the other hand, when a lattice-matched portion in which lattice matching occurs partially exists, interference of electrons spin-polarized when passing through the tunnel barrier layer is appropriately cut in a portion in which no lattice matching occurs, and the spin-polarized electrons easily pass through the tunnel barrier layer. The volume ratio of the lattice-matched portion in the tunnel barrier layer with respect to the volume of the entire tunnel barrier layer is preferably 70 to 95%. When the volume ratio of the lattice-matched portion in the tunnel barrier layer is less than 70%, since the coherent tunneling effect is weakened, the MR ratio decreases. In addition, when the volume ratio of the lattice-matched portion in the tunnel barrier layer exceeds 95%, an effect of electrons spin-polarized when passing through the tunnel barrier layer interfering with each other is not weakened. Thus, there is a possibility that a sufficient improvement in effect of spin-polarized electrons passing through the tunnel barrier layer cannot be obtained.

(Method of Calculating Volume Ratio of Lattice-Matched Portion)

The volume ratio of the lattice-matched portion (lattice-matched part) with respect to the volume of the entire tunnel barrier layer 3 can be estimated from, for example, a TEM image. In order to determine whether lattice matching occurs, in a cross-sectional TEM image, portions of the tunnel barrier layer 3, the first ferromagnetic metal layer 6, and the second ferromagnetic metal layer 7 are subjected to Fourier transform, and an electron beam diffraction image is obtained. In the electron beam diffraction image obtained through Fourier transform, electron beam diffraction places other than in the lamination direction are removed. When this image is subjected to inverse Fourier transform, an image including information about only the lamination direction is obtained. In the lattice line in the inverse Fourier image, a portion in which the tunnel barrier layer 3 is continuously connected to both of the first ferromagnetic metal. layer 6 and the second ferromagnetic metal layer 7 is set as the lattice-matched portion. In addition, the portion in which the tunnel barrier layer 3 is not continuously connected to at least one of the first ferromagnetic metal layer 6 and the second ferromagnetic metal layer 7 in the lattice line, or no lattice line is detected is set as the non-lattice-matched portion. Since the lattice-matched portion is continuously connected from the first ferromagnetic metal layer 6 to the second ferromagnetic metal layer 7 through the tunnel barrier layer 3 in the lattice line in the inverse Fourier image, a width ($L_C$) of the lattice-matched portion can be measured from the TEM image, On the other hand, similarly, since the non-lattice-matched portion is not continuously connected in the lattice line in the inverse Fourier image, a width ($L_I$) of the non-lattice-matched portion can be measured from the TEM image. When the width ($L_C$) of the lattice-matched portion is used as a numerator and a sum of the width ($L_C$) of the lattice-matched portion and the width ($L_I$) of the non-lattice-matched portion is used as a denominator, the volume ratio of the lattice-matched portion with respect to the volume of the entire tunnel harrier layer 3 can be obtained. Here, the TEM image is a cross-sectional image, but it includes information containing a depth. Thus, it can be understood that a region estimated from the TEM image is proportional to the volume.

Figure 10:
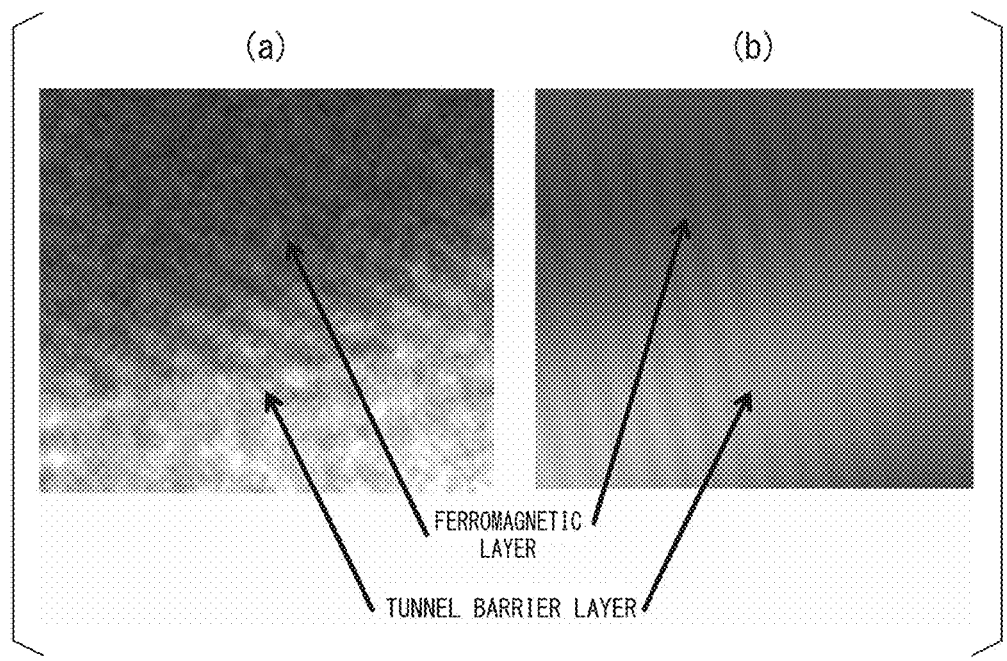
FIG. 10 is an example of a portion at which a tunnel barrier layer and a ferromagnetic metal layer are lattice-matched.

FIG. 10 is an example of a portion in which a tunnel barrier layer and a ferromagnetic metal layer are lattice-matched. FIG. 10(a) is an example of a high resolution cross-sectional TEM image. FIG. 10(b) is an example of an image obtained by removing electron beam diffraction spots other than a lamination direction in an electron beam diffraction image and then performing inverse Fourier transform. In FIG. 10(b), components perpendicular to the lamination direction are removed, and lattice lines can be observed in the lamination direction. It shows that the tunnel barrier layer and the ferromagnetic metal layer are continuously connected without interruption at the interface.

Figure 11:
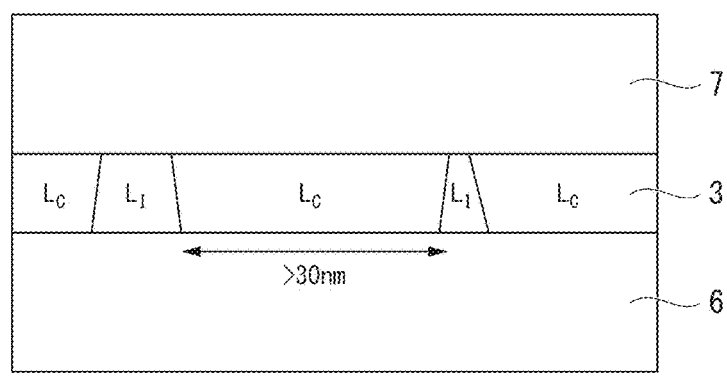
FIG. 11 is a structural view of a cross section including a direction parallel to a laminating direction of the tunnel barrier layer.

FIG. 11 is a schematic structure diagram of a cross section having a direction parallel to a lamination direction of the tunnel barrier layer 3.

As shown in FIG. 11, the size (width: $L_C$) of a lattice-matched portion of the tunnel barrier layer 3 in a direction parallel to a film surface is preferably 30 nm or less in any portion. Approximately, 30 nm is about 10 times a lattice constant of a CoFe alloy which is a material of the first ferromagnetic metal layer 6 and the second ferromagnetic metal layer 7. It is thought that mutual interference of spin-polarized electrons in a direction perpendicular to a tunneling direction before and after coherent tunneling is strengthened to about 10 times the lattice constant for purpose.

EXAMPLES

Example 1

Hereinafter, an example of the method of producing the magnetoresistance effect element according to the first embodiment will be described. Film formation was performed on the substrate 1 on which a thermally oxidized silicon film was provided using a magnetron sputtering method. First, TiN acting as the underlayer 2 was formed on the upper surface of the substrate 1 at 4 nm. The underlayer 2 was obtained by using a Ti target as a target, forming a film of about 10 nm according to the reactive sputtering method using a mixed gas including Ar and nitrogen at a ratio of 1:1 as sputtering gas, and polishing the film using a CMP method to reach the thickness. Next, CoFe was formed on the underlayer 2 as the first ferromagnetic metal layer 6 at 5 nm.

Next, the tunnel barrier layer 3 was formed on the first ferromagnetic metal layer 6. The method of forming the tunnel barrier layer 3 was as follows. A target having a composition of an $MgIn_2$ alloy was sputtered, and $MgIn_2$ was formed into a film at 0.4 nm. Afterwards, the sample was moved to an oxidizing chamber in which ultra-high vacuum of $1\times10^{-8}$ Pa or lower was maintained, and Ar and oxygen were introduced to perform spontaneous oxidation. A time for the spontaneous oxidation was 10 seconds, a partial pressure ratio between Ar and oxygen was 1:25, and a total gas pressure was 0.05 Pa. Then, the sample was returned to the film forming chamber, and $MgIn_2$ was formed into a film at 0.4 nm. Further, the sample was moved to the oxidizing chamber in which the ultra-high vacuum of $1\times10^{-8}$ Pa or lower was maintained, and Ar and oxygen were introduced to perform spontaneous oxidation or inductively coupled plasma oxidation. A time for the spontaneous oxidation was 30 seconds, a time for the inductively coupled plasma oxidation was 5 seconds, a partial pressure ratio between Ar and oxygen was 1:20, and a total gas pressure was 0.08 Pa.

The laminated film was again moved to the film forming chamber, and IrMn of 12 nm/CoFe of 10 nm/Ru of 0.8 nm/CoFe of 7 nm were sequentially formed as the second ferromagnetic metal layer 7. Further, Ru of 3 nm/Ta of 5 nm were formed as a cap layer 4.

The laminated film was placed in an annealing apparatus, was processed in Ar at a temperature of 350° C. for 10 minutes, and then was processed at a temperature of 250° C. for 6 hours in a state in which a magnetic field of 8 kOe was applied.

Next, the magnetoresistance effect device having the constitution illustrated in FIGS. 8 and 9 was prepared. First, the electrode layer 5 was formed on the cap layer 4. Next, a photoresist was formed using electron-beam lithography such that the electrode layer 5 had a rotational direction of 90 degrees. Portions other than a portion under the photoresist were eliminated by an ion milling method, and the thermally oxidized silicon film that was the substrate was exposed to form a shape of the underlayer 2. Further, the photoresist was formed at a constricted portion of the shape of the underlayer 2 using the electron-beam lithography so as to be a columnar shape of 80 nm, portions other than a portion under the photoresist were eliminated by the ion milling method, and the underlayer 2 was exposed. Afterwards, SiOx acting as an insulating layer was formed at the portions cut by the ion milling method. The photoresist having the columnar shape of 80 nm was removed here. The photoresist was prevented from being formed only at portions of the electrode pads of FIGS. 8 and 9, the insulating layer was removed by the ion milling method, and the underlayer 2 was exposed. Afterwards, Au was formed. The electrode pads 8 functioned as contact electrodes with respect to the underlayer 2 of the laminated film. Subsequently, to obtain the electrode layer of FIGS. 8 and 9, a shape was formed by the photoresist and the ion milling method, and Au was formed. This functions as a contact electrode with respect to the electrode layer of the laminated film.

Physical properties of the obtained magnetoresistance effect element, and a composition and structure of the tunnel barrier layer were evaluated as follows.

(Characteristics Evaluation)

The MR ratio and the resistance area (RA) of the obtained magnetoresistance effect element were measured according to the above evaluating method. The MR ratio was measured on the condition that a bias voltage was 0.1 V.

(Composition Analysis of the Tunnel Barrier Layer)

A composition analysis of the tunnel barrier layer was performed using energy dispersive X-ray spectrometry (EDS).

A composition of the tunnel barrier layer was fixed by setting a content (the number of atoms) of Al to 2 and measuring a relative amount of divalent cations (Mg and Zn). A content of O was not measured. However, even when an amount of O in an oxide generally deviated from a quantitative ratio, a crystal structure could be maintained.

(Structure Analysis of the Tunnel Barrier Layer)

For a structure analysis of the tunnel barrier layer, a crystal structure and a lattice constant were evaluated.

The crystal structure was evaluated by an electron diffraction pattern using a transmission electron beam. When a structure of the barrier layer was checked by this method, there was no reflection from {022} planes represented with an ordered spinel structure. In this case, the barrier layer was regarded to have a spinel structure in which cubic cations were disordered (Sukenel structure).

The lattice constant was evaluated using a four-axis X-ray diffractometer. In the evaluation of the lattice constant, it was difficult to decide the lattice constant with a thickness of the tunnel barrier layer of the example.

For this reason, to obtain the lattice constant of the tunnel barrier layer, a substrate in which the tunnel barrier layer (a thickness of 100 nm) was formed on a Si substrate with a thermally oxidized film was used. The Si substrate with a thermally oxidized film had a surface that was amorphous SiOx, and was hardly affected when the tunnel barrier layer was formed.

The tunnel barrier layer (a thickness of 100 nm) had a film thickness at which an influence on lattice strain caused by the substrate was sufficiently relieved, and at which X-ray intensity for a sufficient structure analysis could be obtained.

Example 2

With the exception that NbN was formed as the underlayer 2 at 4 nm, the magnetoresistance effect element was prepared in the same manner as in Example 1, and physical properties of the obtained magnetoresistance effect element and a composition and structure of the tunnel barrier layer were evaluated. The underlayer was obtained by using a Nb target as a target, forming a film of about 10 nm according to a reactive sputtering method using mixed gas including Ar and nitrogen at a volume ratio of 1:1 as sputtering gas, and polishing the film using a CMP method to become the thickness.

Example 3

With the exception that TaN was formed as the underlayer 2 at 4 nm, the magnetoresistance effect element was prepared in the same manner as in Example 1, and physical properties of the obtained magnetoresistance effect element and a composition and structure of the tunnel barrier layer were evaluated. The underlayer was obtained by using a Ta target as a target, forming a film of about 10 nm according to a reactive sputtering method using mixed gas including Ar and nitrogen at a volume ratio of 1:1 as sputtering gas, and polishing the film using a CMP method to become the thickness.

Example 4

With the exception that ZrN was formed as the underlayer 2 at 4 nm, the magnetoresistance effect element was prepared in the same manner as in Example 1, and physical properties of the obtained magnetoresistance effect element and a composition and structure of the tunnel barrier layer were evaluated. The underlayer was obtained by using a Zr target as a target, forming a film of about 10 nm according to a reactive sputtering method using mixed gas including Ar and nitrogen at a volume ratio of 1:1 as sputtering gas, and polishing the film using a CMP method to become the thickness.

Example 5

With the exception that $Ta_{60}Ti_{40}N$ that was a mixed crystal containing TaN and TiN was formed as the underlayer 2 at 4 nm, the magnetoresistance effect element was prepared in the same manner as in Example 1, and physical properties of the obtained magnetoresistance effect element and a composition and structure of the tunnel barrier layer were evaluated. The underlayer was obtained by using a Ta—Ti alloy target as a target, forming a film of about 10 nm according to a reactive sputtering method using mixed gas including Ar and nitrogen at a volume ratio of 1:1 as sputtering gas, and polishing the film using a CMP method to become the thickness.

Example 6

With the exception that the tunnel barrier layer 3 was formed as follows, the magnetoresistance effect element was prepared in the same manner as in Example 2, and physical properties of the obtained magnetoresistance effect element and a composition and structure of the tunnel barrier layer were evaluated.

A target having a composition of a $ZnIn_2$ alloy was sputtered to form $ZnIn_2$ into a film of 0.4 nm.

Afterwards, the sample was moved to an oxidizing chamber in which ultra-high vacuum of $1\times10^{-8}$ Pa or lower was maintained, and Ar and oxygen were introduced to perform spontaneous oxidation. A time for the spontaneous oxidation was 10 seconds, a partial pressure ratio between Ar and oxygen was 1:25, and a total gas pressure was 0.05 Pa. Afterwards, the sample was returned to a film forming chamber, and $ZnIn_2$ was formed into a film of 0.4 nm. Further, the sample was moved to the oxidizing chamber in which the ultra-high vacuum of $1\times10^{-8}$ Pa or lower was maintained, and Ar and oxygen were introduced to perform spontaneous oxidation or inductively coupled plasma oxidation. A time for the spontaneous oxidation was 30 seconds, a time for the inductively coupled plasma oxidation was 5 seconds, a partial pressure ratio between Ar and oxygen was 1:20, and a total gas pressure was 0.08 Pa.

Example 7

With the exception that the tunnel barrier layer 3 and the second ferromagnetic metal layer 7 were formed as follows, the magnetoresistance effect element was prepared in the same manner as in Example 3, and characteristics evaluation and a structure analysis of the tunnel barrier layer were evaluated.

The tunnel barrier layer 3 was formed as follows. A target having a composition of an $Mg_{0.77}In_2$ alloy was sputtered to form $Mg_{0.77}In_2$ into a film of 0.4 nm. Afterwards, the sample was moved to an oxidizing chamber in which ultra-high vacuum of $1\times10^{-8}$ Pa or lower was maintained, and Ar and oxygen were introduced to perform spontaneous oxidation. A time for the spontaneous oxidation was 10 seconds, a partial pressure ratio between Ar and oxygen was 1:25, and a total gas pressure was 0.05 Pa. Afterwards, the sample was returned to a film forming chamber, and the target having a composition of an $Mg_{0.77}In_2$ alloy was sputtered to form $Mg_{0.77}In_2$ into a film of 0.4 nm. Further, the sample was moved to the oxidizing chamber in which the ultra-high vacuum of $1\times10^{-8}$ Pa or lower was maintained, and Ar and oxygen were introduced to perform spontaneous oxidation or inductively coupled plasma oxidation. A time for the spontaneous oxidation was 30 seconds, a time for the inductively coupled plasma oxidation was 5 seconds, a partial pressure ratio between Ar and oxygen was 1:20, and a total gas pressure was 0.08 Pa.

For the second ferromagnetic metal layer 7, in place of CoFe, a composition of a $Co_2Mn_{0.7}Fe_{0.3}Si_{0.66}Al_{0.36}$ alloy was formed into a film. As the second ferromagnetic metal layer 7, IrMn of 12 nm/CoFe of 10 nm/Ru of 0.8 nm/CoFe of 2 nm/$Co_2Mn_{0.7}Fe_{0.3}Si_{0.66}Al_{0.36}$ of 5 nm were formed in turn. However, only when the composition of the $Co_2Mn_{0.7}Fe_{0.3}Si_{0.66}Al_{0.36}$ alloy was formed into a film, the substrate was formed by heating to 450° C.

Comparative Example 1

With the exception that VN was formed as the underlayer 2 at 4 nm, the magnetoresistance effect element was prepared in the same manner as in Example 1, and physical properties of the obtained magnetoresistance effect element and a composition and structure of the tunnel barrier layer were evaluated. The underlayer was obtained by using a V target as a target, forming a film of about 10 nm according to a reactive sputtering method using mixed gas including Ar and nitrogen at a volume ratio of 1:1 as sputtering gas, and polishing the film using a CMP method to become the thickness.

(Comparison Between Examples and Comparative Example)

In the magnetoresistance effect elements prepared in Examples 1 to 7 and Comparative Example 1, a composition of each layer, a lattice constant of the nitride of which the underlayer 2 is formed, a lattice constant of the compound of which the tunnel barrier layer 3 is formed, a lattice-mismatching degree between the underlayer 2 and the tunnel barrier layer 3, an MR ratio, and a resistance area (RA) are shown in Table 1. The lattice constant of the nitride is a value when a space group is Fm-3m and when a crystal structure is a tetragonal structure (a NaCl structure). The Lattice-mismatching degree is a value calculated by setting a of the above formula to 1.

All of the tunnel barrier layers 3 of the magnetoresistance effect elements prepared in Examples 1 to 7 and Comparative Example 1 were a disordered spinel structure (a Sukenel structure).

TABLE 1

| | Underlayer | | | Tunnel barrier layer | | | | Lattice-mismatching degree [%] | MR ratio @ 0.1 V [%] | RA [Ω·μm²] |
|---|---|---|---|---|---|---|---|---|---|---|
| | Composition | Lattice constant (nm) | First ferromagnetic metal layer | Composition | Lattice constant (nm) | Second ferromagnetic metal layer | Cap layer | | | |
| Example 1 | TiN | 0.4241 | CoFe | MgIn$_2$O$_y$ | 0.4432 | IrMn/CoFe/Ru/CoFe | Ru/Ta | 4.5 | 78.0 | 0.15 |
| Example 2 | NbN | 0.4391 | CoFe | MgIn$_2$O$_y$ | 0.4432 | IrMn/CoFe/Ru/CoFe | Ru/Ta | 0.9 | 102.0 | 0.17 |
| Example 3 | TaN | 0.4330 | CoFe | MgIn$_2$O$_y$ | 0.4432 | IrMn/CoFe/Ru/CoFe | Ru/Ta | 2.4 | 91.0 | 0.18 |
| Example 4 | ZrN | 0.4573 | CoFe | MgIn$_2$O$_y$ | 0.4432 | IrMn/CoFe/Ru/CoFe | Ru/Ta | 3.1 | 84.0 | 0.17 |
| Example 5 | TaN + TiN | 0.4294 | CoFe | MgIn$_2$O$_y$ | 0.4432 | IrMn/CoFe/Ru/CoFe | Ru/Ta | 3.2 | 83.0 | 0.16 |
| Example 6 | NbN | 0.4391 | CoFe | ZrIn$_2$O$_y$ | 0.4465 | IrMn/CoFe/Ru/CoFe | Ru/Ta | 1.7 | 72.8 | 0.15 |
| Example 7 | TaN | 0.4330 | Co$_2$Mn$_{0.7}$Fe$_{0.3}$Si$_{0.66}$Al$_{0.36}$ | Mg$_{0.77}$In$_2$O$_y$ | 0.4494 | IrMn/CoFe/Ru/CoFe | Ru/Ta | 3.8 | 131.0 | 0.14 |
| Comparative Example 1 | VN | 0.4135 | CoFe | MgIn$_2$O$_y$ | 0.4432 | IrMn/CoFe/Ru/CoFe | Ru/Ta | 7.2 | 60.0 | 0.19 |

It is found that, in comparison with the magnetoresistance effect element prepared in Comparative Example 1, the magna to resistance effect elements prepared in Examples 1 to 7 have a high MR ratio and a low RA. This is thought to be because, in comparison with the magnetoresistance effect element of Comparative Example 1, the magnetoresistance effect elements of Examples 1 to 7 are configured such that the lattice-mismatching degree between the lattice constant of the crystal of the material of which the tunnel barrier layer is formed and the lattice constant of the crystal that can be taken by the nitride of which the underlayer is formed is low.

It is especially found that the magnetoresistance effect element of Example 7 in which the tunnel barrier layer is formed in the disordered spinel structure (Mg$_{0.77}$In$_2$O$_y$) and the Heusler alloy is used for the first ferromagnetic metal layer has a high MR ratio and a low RA.

It was confirmed from the results of the above examples that, according to the present invention, the magnetoresistance effect element that produced a high MR ratio at a low RA was obtained.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES

100: Magnetoresistance effect element
200: Magnetoresistance effect device
1: Substrate
2: Underlayer
3: Tunnel barrier layer
4: Cap layer
5: Electrode layer
6: First ferromagnetic metal layer
7: Second ferromagnetic metal layer
8: Electrode pad
71: Current source
72: Voltmeter

What is claimed is:

1. A magnetoresistance effect element comprising a laminate in which an underlayer, a first ferromagnetic metal layer, a tunnel barrier layer, and a second ferromagnetic metal layer are laminated in that order,
   wherein the underlayer is made of TiN, NbN, TaN, ZrN or mixed compositions thereof,
   the tunnel barrier layer is made of a compound that has a spinel structure and expressed by composition formula (1) below:

$$A_x In_2 O_y \qquad (1):$$

where A is a non-magnetic divalent cation and represents cations of one or more elements selected from a group consisting of magnesium and zinc, x represents a number satisfying 0<x≤2, and y represents a number satisfying 0<y≤4,
   the tunnel barrier layer comprises a lattice-matched portion that lattice-matches with both of the first ferromagnetic metal layer and the second ferromagnetic metal layer, and a lattice-mismatched portion that is free of lattice-matching with at least one of the first ferromagnetic metal layer and the second ferromagnetic metal layer,
   the lattice-matched portion includes a plurality of sequentially connected lattice lines, and the lattice-mismatched portion includes a plurality of sequentially unconnected lattice lines, and
   the lattice-mismatched portion is disposed in a location separated from each of two side ends of the tunnel barrier layer and the lattice-matched portion is interposed between the lattice-mismatched portion and one of the two side ends.

2. The magnetoresistance effect element according to claim 1, wherein the tunnel barrier layer has a spinel structure in which atomic arrangement is disordered.

3. The magnetoresistance effect element according to claim 1, wherein a coercivity of the second ferromagnetic metal layer is greater than a coercivity of the first ferromagnetic metal layer.

4. The magnetoresistance effect element according to claim 2, wherein a coercivity of the second ferromagnetic metal layer is greater than a coercivity of the first ferromagnetic metal layer.

5. The magnetoresistance effect element according to claim 1, wherein a thickness of the tunnel barrier layer is 0.7 nm or more and 1.7 nm or less.

6. The magnetoresistance effect element according to claim 1, wherein a thickness of the underlayer is 1.0 nm or more and 20.0 nm or less.

7. The magnetoresistance effect element according to claim 2, wherein a thickness of the underlayer is 1.0 nm or more and 20.0 nm or less.

8. The magnetoresistance effect element according to claim 3, wherein a thickness of the underlayer is 1.0 nm or more and 20.0 nm or less.

9. The magnetoresistance effect element according to claim 4, wherein a thickness of the underlayer is 1.0 nm or more and 20.0 nm or less.

10. The magnetoresistance effect element according to claim 5, wherein a thickness of the underlayer is 1.0 nm or more and 20.0 nm or less.

11. The magnetoresistance effect element according to claim 1, wherein at least one of the first ferromagnetic metal layer and the second ferromagnetic metal layer has a magnetic anisotropy that is perpendicular to a laminating direction.

12. The magnetoresistance effect element according to claim 1, wherein at least one of the first ferromagnetic metal layer and the second ferromagnetic metal layer is $Co_2Mn_{1-a}Fe_aAl_bSi_{1-b}$ ($0 \leq a \leq 1$ and $0 \leq b \leq 1$).

13. A magnetoresistance effect element comprising a laminate in which an underlayer, a first ferromagnetic metal layer, a tunnel barrier layer, and a second ferromagnetic metal layer are laminated in that order, wherein the underlayer is made of TiN, NbN, TaN, ZrN or mixed compositions thereof, the tunnel barrier layer is made of a compound that has a spinel structure and expressed by composition formula (1) below:

$$A_xIn_2O_y \quad (1):$$

where A is a non-magnetic divalent cation and represents cations of one or more elements selected from a group consisting of magnesium and zinc, x represents a number satisfying $0<x\leq 2$, and represents a number satisfying $0<y\leq 4$, the tunnel barrier layer comprises a plurality of lattice-matched portions, each of which lattice-matches with both of the first ferromagnetic metal layer and the second ferromagnetic metal layer, and a plurality of lattice-mismatched portions, each of which is free of lattice-matching with at least one of the first ferromagnetic metal layer and the second ferromagnetic metal layer, each of the lattice-matched portions includes a plurality of sequentially connected lattice lines, and each of the lattice-mismatched portion includes a plurality of sequentially unconnected lattice lines, and a lattice-matched portion is disposed on one side end of the tunnel barrier layer followed by alternating lattice-mismatched portions and lattice-matched portions to the other side end of the tunnel barrier layer.

* * * * *